(12) United States Patent
Katsap

(10) Patent No.: US 9,790,620 B1
(45) Date of Patent: Oct. 17, 2017

(54) METHOD OF REDUCING WORK FUNCTION IN CARBON COATED LAB6 CATHODES

(71) Applicants: NuFlare Technology, Inc., Yokohama-shi (JP); NuFlare Technology America, Inc., Sunnyvale, CA (US)

(72) Inventor: Victor Katsap, Cornwall, NY (US)

(73) Assignees: NuFlare Technology, Inc., Yokohama-shi (JP); NuFlare Technology America, Inc., Sunnyvale, CA (US)

( * ) Notice: Subject to any disclaimer, the term of this patent is extended or adjusted under 35 U.S.C. 154(b) by 0 days.

(21) Appl. No.: 15/400,427

(22) Filed: Jan. 6, 2017

(51) Int. Cl.
*H01J 1/148* (2006.01)
*C30B 29/66* (2006.01)
*C30B 29/10* (2006.01)
*B05D 3/06* (2006.01)
*H01J 9/04* (2006.01)
*B05D 3/04* (2006.01)

(52) U.S. Cl.
CPC ............... *C30B 29/66* (2013.01); *B05D 3/06* (2013.01); *C30B 29/10* (2013.01); *H01J 9/042* (2013.01); *B05D 3/048* (2013.01); *H01J 1/148* (2013.01)

(58) Field of Classification Search
USPC ................................. 427/74, 77; 313/346 R
See application file for complete search history.

(56) References Cited

U.S. PATENT DOCUMENTS

| 4,055,780 | A | * | 10/1977 | Kawai | H01J 1/148 252/509 |
|---|---|---|---|---|---|
| 4,482,839 | A | * | 11/1984 | Wada | H01J 1/148 313/336 |
| 4,528,474 | A | * | 7/1985 | Kim | H01J 1/15 313/300 |
| 7,176,610 | B2 | | 2/2007 | Katsap | |
| 8,968,045 | B2 | * | 3/2015 | Saito | H01J 1/13 313/421 |
| 9,165,737 | B2 | | 10/2015 | Katsap | |
| 9,299,525 | B2 | * | 3/2016 | Kobayashi | H01J 1/148 |
| 2005/0174030 | A1 | | 8/2005 | Katsap | |
| 2014/0097736 | A1 | | 4/2014 | Katsap | |

* cited by examiner

*Primary Examiner* — Brian K Talbot
(74) *Attorney, Agent, or Firm* — Oblon, McClelland, Maier & Neustadt, L.L.P.

(57) ABSTRACT

A method to reduce the work function of a carbon-coated lanthanum hexaboride (LaB6) cathode wherein the exposed tip of the cathode is exposed to moisture between two heat treatments is provided. The work function may be reduced by 0.01 eV or more.

9 Claims, 3 Drawing Sheets

METHOD OF REDUCING WORK FUNCTION IN CARBON COATED LAB6 CATHODES

BACKGROUND OF THE INVENTION

Field of the Invention

The present invention relates to a method to lower the work function (WF) of a carbon coated $LaB_6$ (LaB6) cathode during the manufacture thereof so that cathodes of high brightness and beam current density are provided.

Background of the Invention

Single crystal $LaB_6$, or lanthanum hexaboride, cathodes (commonly referenced as LaB6 cathode) are used as the electron source in various electron-beam tools including lithographic tools, scanning electron microscopes (SEMs), and transmission electron microscopes (TEMs). Throughout the following description the formula $LaB_6$ will be used to describe the material lanthanum hexaboride and the cathode structure described according to conventional practice as LaB6. A typical LaB6 cathode emitter is tapered, or cone-shaped, with a specified size, cone angle, and tip, or truncation. The tip (truncation) may be flat or spherical with a diameter ranging from 5 to 100 µm, and a cone angle may be from 60 to 110 degrees, depending on the application. A schematic drawing of a cathode showing the tip and cone is indicated in FIG. 1. The tip typically represents a (100) crystalline plane. In order to preserve the integrity of the cone shape and the tip and thus extend the useful lifetime of the cathode as a thermionic emitter, a carbon coating is applied to at least the cathode cone surface. Carbon coated cathodes are described in U.S. Pat. No. 7,176,610 and U.S. Pat. No. 9,165,737, the disclosures of which are incorporated herein by reference in their entireties.

Lanthanum hexaboride ($LaB_6$) is a refractory crystalline material that has a melting point of 2210° C. It is purple as a crystalline material and is insoluble in water and hydrochloric acid. However, $LaB_6$ is hygroscopic and conventionally during manufacture and storage the LaB6 cathodes are kept in inert environments which are moisture-free.

$LaB_6$ has cubic crystalline structure and conventionally, commercial cathodes are made in such a way that the flat non-carbon coated tip represents a (100) crystalline plane, which is considered most stable and having relatively low Work Function (WF). The performance of the LaB6 cathode in terms of electron angular intensity and brightness is related to the morphological purity of the tip with regard to the (100) crystal plane. At cathode operating temperatures, $LaB_6$ evaporates with a rate that depends on temperature and vacuum pressure. A typical evaporation loss rate may be as much as approximately 1 micron/100 hours of operation. Generally, the higher the operating temperature, the faster the evaporation rate and the effect of this evaporation is the eventual loss of tip structure wherein the (100) plane is no longer exposed, such that the cathode optics and emission are adversely affected and thus limiting the useful operational lifetime of the cathode. Therefore, it is advantageous to operate the cathode at a lowest temperature possible which still provides the emission current density required for the task, i.e. to have a LaB6 cathode with lowest WF.

The cathode emitter is generally shaped and cut in form a single crystal obtained by methods known to those of skill in the art. The tip may be obtained by a mechanical cutting operation which results in a degree of surface roughness which may be polished during the manufacture of the commercial cathode. However, even fine polishing leaves a so-called damaged crystalline sub-surface layer as thin as a fraction of a micron and electrons are emitted from this layer. The WF and brightness of the cathode is directly related to the quality of the tip.

Thus, there is a need for a manufacturing method to produce carbon coated LaB6 cathodes having tips of high morphological purity such that higher cathode brightness at a set temperature is obtained or such that an operational set brightness can be obtained at a lower working temperature. In this way, the operational lifetime of the cathode may be increased. The object of the present invention is to provide a method of cathode manufacture which enhances the cathode tip morphological integrity, i.e., eliminates the damaged sub-surface layer described previously and thus provides a cathode of low WF, extended lifetime and/or higher brightness at a given operational temperature.

SUMMARY OF THE INVENTION

This and other objects have been achieved by the present invention, the first embodiment of which provides a method to prepare a LaB6 cathode, comprising:

preparing an emitter structure of a LaB6 single crystal, the emitter structure comprising:
  a lower cylindrical or rectangular portion,
  an upper tapered portion having a conical shape surface, and
  a flat surface truncated tip;

applying a carbon coating to at least the conical surface of the upper taper portion while retaining the flat surface of the truncated tip free of carbon coating to obtain a precursor LaB6 cathode;

initially heating the precursor LaB6 cathode to a temperature of from 1700 K to 2000K under vacuum of $1\times10^{-7}$ to $1\times10^{-8}$ Torr;

cooling the first heat treated precursor LaB6 cathode to ambient temperature;

exposing the ambient temperature precursor LaB6 cathode to an atmosphere comprising water vapor; and performing a second heating of the precursor LaB6 cathode at an emission temperature of from 1700 K to 2000K under vacuum of $1\times10^{-7}$ to $1\times10^{-8}$ Torr to obtain the LaB6 cathode.

In an aspect of the first embodiment, a difference between a Work Function value of the precursor LaB6 ($WF_1$) and a Work Function value of the LaB6 cathode ($WF_2$) satisfies the following relationship:

$$WF_1 - WF_2 \geq 0.01 \text{ eV.}$$

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS OF THE INVENTION

As described in U.S. Pat. No. 7,176,610 and U.S. Pat. No. 9,165,737, both of which are incorporated herein by reference, in their entireties, during manufacture of the LaB6 cathode, a single crystal is shaped to have a lower cylindrical or rectangular portion or body, an upper tapered portion having a conical shape surface, and a flat surface truncated tip with (100) plane exposed.

The emitter body is generally cylindrical or substantially cylindrical in shape, having straight sides which may be coated with a carbon coating. The length of the emitter body generally ranges from about 0.50 to about 3 mm. The emitter body cross-section is generally round or rectangular, with a diameter (or width, if a rectangle) in the range of from about 200 μm to about 800 μm.

Figure 1:
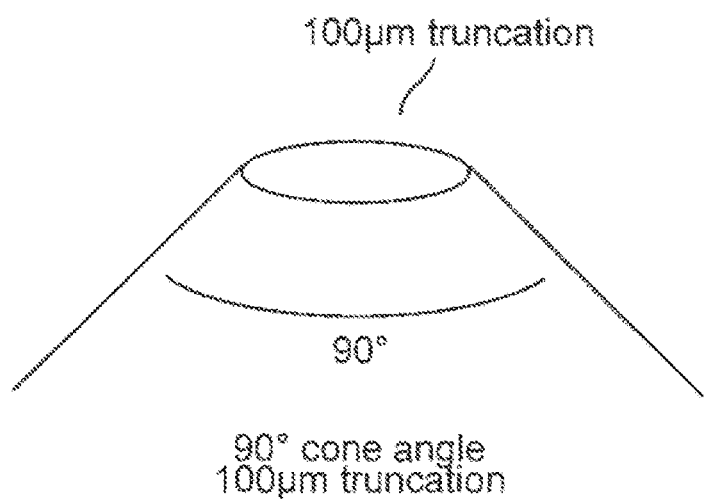
FIG. 1 shows a schematic drawing of an emitter cone angle and tip with a cone angle of 90°.

An upper section of the emitter, e.g. about the upper 50-200 μm of the emitter crystal, may generally be conical in shape, with a cone angle in the range of from about 200 to about 90° and is preferably in the range from about 60 to about 90 degrees. In some embodiments, the cone angle is 60 degrees. An exemplary cone angle of 90 degrees is shown in FIG. 1.

The upper conical section of the emitter may be about 10 μm to about 100 μm wide, i.e. about 10, 20, 30, 40, 50, 60, 70, 80, 90, 100 μm in width.

The cathode emitter tip may be flat or spherical, and may range in size from as small as about 5 μm to as large as about 400 μm in diameter, depending on the desired application.

A carbon coating is applied to at least an outer surface of the cone and may encase part or all of the lower cylindrical or rectangular portion, as well. The carbon layer or coating may be formed from any suitable material, examples of which include but are not limited to graphite, colloidal graphite (e.g. aquadag), DLC (diamond-like carbon), pyrolytic carbon, etc. The carbon coating may preferably be pyrolytic carbon or diamond-like carbon (DLC) and a thickness of the carbon coating may be up to 100 μm, preferably, from 8 to 10 μm.

The carbon coating may be directly in contact with the $LaB_6$ surface or separated by a gap as described in U.S. Pat. No. 9,165,737.

In the application of the carbon coating a $LaB_6$ shaped single crystal may be placed into a chamber filled with a carbon-rich gas, for example, propane or butane, and heated to a temperature sufficient to pyrolyze the gas and form a pyrolytic carbon coating on the emitter. Carbon deposited on the tip may be removed by polishing to again expose the (100) surface.

The precursor LaB6 cathode obtained from the polishing of the tip may then be placed in a vacuum chamber under vacuum of $1 \times 10^{-7}$ to $1 \times 10^{-8}$ Torr, preferably approximately $1 \times 10^{-7}$ Torr and heated to a temperature of from 1600 K to 2000K, preferably 1700K to 1900K and most preferably 1750 to 1850K. The time of this initial treatment may be from 6 to 24 hours, preferably 6 to 12 hours and most preferably 6 to 8 hours.

Following the initial or first heat treatment, heat treated precursor LaB6 cathode may be cooled to ambient temperature (18 to 25° C.) and then, contrary to conventional practice, the heat treated precursor LaB6 cathode may be exposed to an atmosphere comprising water vapor. The relative humidity of the atmosphere comprising water may be from 70 to 95%, preferably 80 to 95% and most preferably 85 to 95%. The time of exposure may be from 30 minutes to 8 hours, preferably 1 to 5 hours and most preferably 2-4 hours. The atmosphere comprising water may be obtained by venting the vacuum chamber to an ambient atmosphere having the disclosed relative humidity or may be obtained by passing an inert gas such as argon and/or nitrogen which is saturated with moisture into the chamber. These are not limiting embodiments and one of ordinary skill may envision other suitable methods to expose the tip to moisture.

Following the exposure to moisture a second heating of the precursor LaB6 cathode at a temperature of from 1700 K to 2000K under vacuum of $1 \times 10^{-7}$ to $1 \times 10^{-8}$ Torr may be performed to obtain the $LaB_6$ cathode. The second heat treatment may be for a period of 3 to 6 hours and a preferred temperature may be from 1750 to 1850 K. As in the first heat treatment the vacuum for the second treatment may be approximately $1 \times 10^{-7}$ Torr or greater.

The effect of the method may be monitored by comparison of the Work Function of the cathode after the first heat treatment and before exposure to moisture ($WF_1$) and after the second heat treatment ($WF_2$) following exposure to moisture. The work function WF for a given surface may be defined by the equation $$WF = -e\phi - E_F$$

where $-e$ is the charge of an electron, $\phi$ is the electrostatic potential in the vacuum nearby the surface, and $E_F$ is the Fermi level or electrochemical potential of electrons inside the $LaB_6$. The term $-e\phi$ is the energy of an electron at rest in the vacuum nearby the surface. The work function may be considered as a measure of the thermodynamic work required to remove an electron from the material and may be related to the temperature at which the cathode is an effective thermoelectric emitter. In other words, the lower the WF value of the cathode the lower the temperature at which electrons are emitted and higher cathode brightness at the same operating temperature is obtained.

As described above, an object of the present invention is to provide cathodes having higher brightness at a set temperature or cathodes wherein an operational set brightness can be obtained at a lower working temperature.

Accordingly, the present invention includes the measurement and monitoring of WF as an aspect of the embodiment described above. The inventors have surprisingly discovered, that contrary to conventional wisdom in the art where the hygroscopic $LaB_6$ is protected from exposure to moisture, controlled exposure to moisture according to the elements of the embodiment of the present invention leads to a cathode having lower WF, thus meeting the object of the invention described above.

Not wishing to be bound by theory, the inventor believes that controlled exposure of the tip following the first heat treatment leads to absorption of water into the tip crystal lattice within the structure of the sub-surface layer. Thus during the second heat treatment the water may promote evaporation of $LaB_6$ from the rough surface resulting in pristine crystalline (100) surface or the water may react with the $LaB_6$ surface to form more volatile oxides such as LaO and BO which evaporate leaving a (100) surface.

Measurement of the WF value of a cathode may be conducted by methods including thermionic emission (TE), field emission retarding potential (FERP) and photoelectric methods (see Gesley et al, Surface Science, 146, 1984, 583-599 and references listed therein). The inventor has devised and implemented a simplified and direct method to measure and monitor the WF value of a cathode using equipment conventionally found in the LaB6 cathode manufacturing environment.

Figure 2:
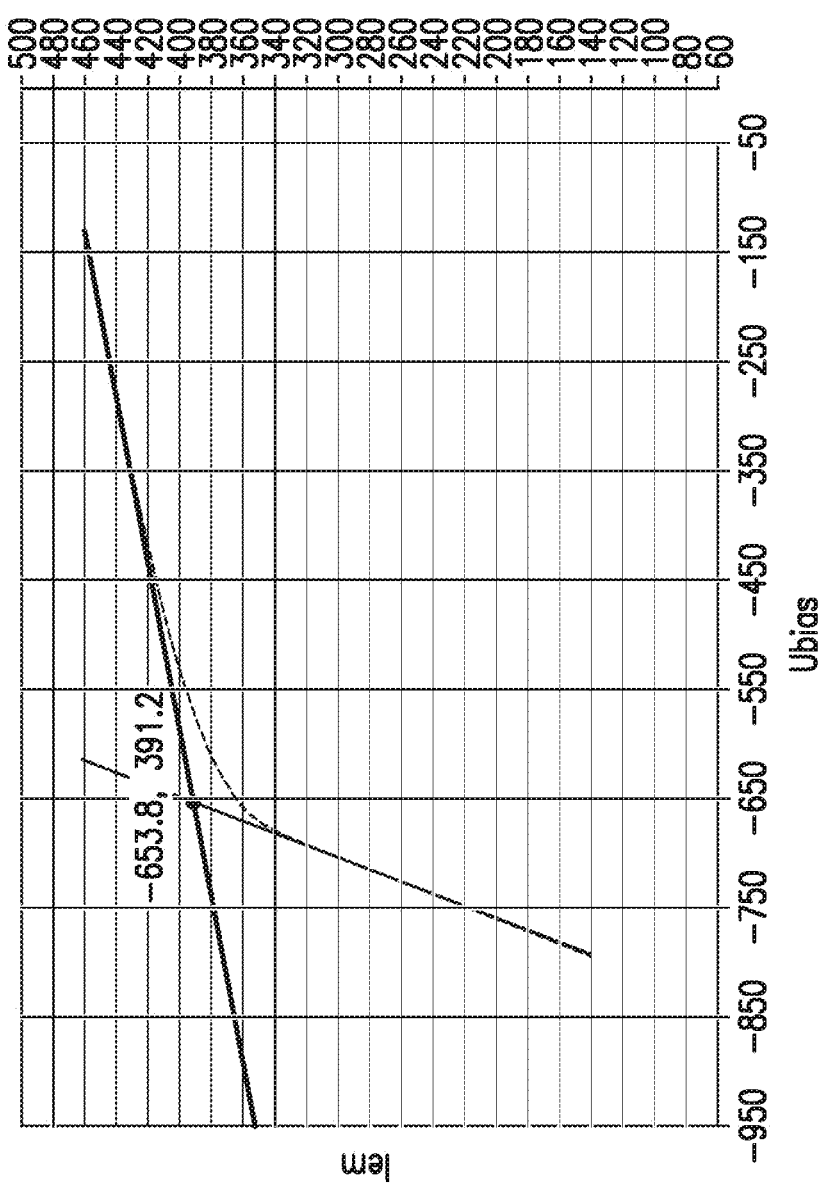
FIG. 2 shows an I-V curve for a WF measurement as described in the specification and according to the Example.

This equipment includes a 50 kV triode gun, driven by a high voltage power supply (HVPS) having a stabilized anode voltage, a stabilized heater circuit and emission control via bias control. With this system, current vs voltage curves such as shown in FIG. 2 (Iem, µA vs Ubias, V) are generated.

Figure 3:
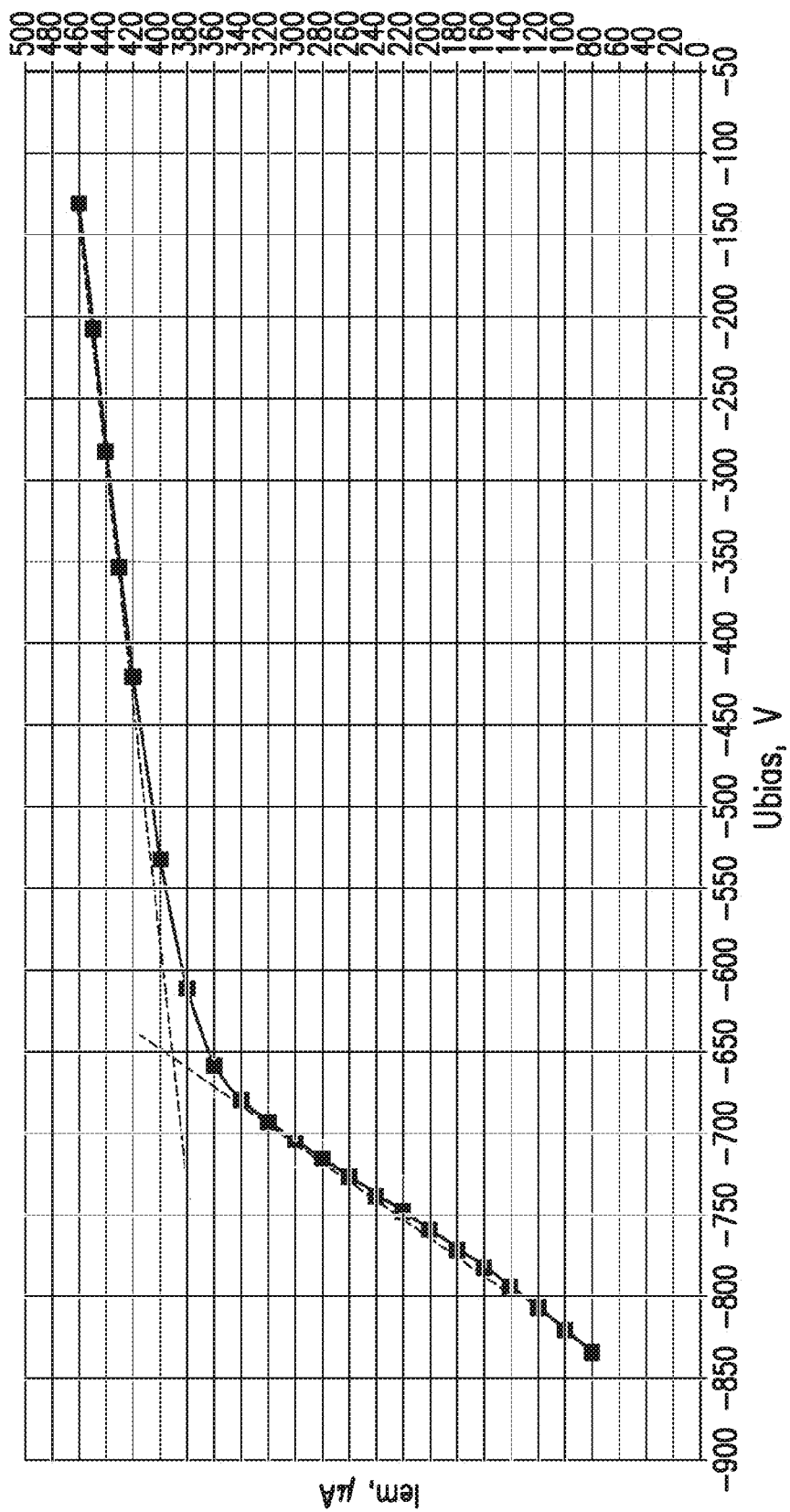
FIG. 3 shows the same I-V curve as FIG. 2 with experimental points of the I-V curve.

The inventor has determined experimentally that using "zero-field emission resulted in wide spread variation of saturated emission current values in the same cathode. Therefore, a linear approximation of rising leg and plateau of the I-V curve was employed and the value of Iem at the intersection point of the two lines is designated as the saturated emission current for the cathode being tested. This is demonstrated in FIG. 2 where the broken line is the curve for the actual data and the solid lines represent the calculated linear approximations. FIG. 3 shows the data points of the I-V curve. Then by comparing multiple experimental I-V curves with curves computed with MEBS™ software, a Richardson constant (A) of 80 A/cm$^2$*K$^2$ was determined.

The Richardson-Dushman (RD) equation relates the current density of a thermionic emission to the work function (W) and temperature (T) of the emitting material:

$$j_s = AT^2 \exp(-W/kT)$$

where $j_s$ is the current density of the emission (mA/mm$^2$), A is Richardson's constant, T is temperature (K), W is the work function herein WF) of the cathode material (eV) and k is the Boltzmann constant (8.6173324E-5 eV K-1).

Thus the WF value of a carbon coated cathode of the present invention may be determined by obtaining the I-V curve of the cathode at a specified temperature, conducting the linear approximation to obtain a saturated emission current value ($j_s$) and computing the WF value from the RD equation. This computation may be automated and conducted in as little as one minute thus allowing rapid and facile WF measurement in a manufacturing environment.

For example, in FIG. 2 determination of the experimental values was at T=1833K. The saturated emission current was 391.2 µA. The tip diameter of the cathode tested was 50.1 µm and $j_s$ was 19.8 A/cm$^2$ and thus from the RD equation a WF value of 2.598 eV was determined.

The WF value for a conventional carbon coated cathode as described above prepared without use of the method of the first embodiment may be from 2.670 to 2.720 eV or higher.

However, the inventor has surprisingly discovered that treatment of the carbon coated cathode according to the method described in the first embodiment results in a decrease of the WF value of the final cathode in comparison to the WF value of the cathode obtained after the first heat treatment. Thus in another aspect of the invention a difference between a Work Function value of the precursor LaB6 (WF$_1$) after the first heat treatment and a Work Function value of the LaB6 cathode (WF$_2$) obtained after the exposure to moisture and second heat treatment satisfies the following relationship:

$$WF_1 - WF_2 \geq 0.01 \text{ eV}.$$

Typically the difference (WF$_1$-WF$_2$) may be from 0.01 to 0.05 eV.

The treatment sequence described as the first embodiment may be repeated one or more times with corresponding reduction in WF$_2$. The lowest obtained WF for LaB6 cathode as described above is 2.590 eV and therefore, repeating the treatment sequence of the first embodiment may reach a level of diminishing return with regard to production time expended relative to value of WF reduction.

A total time for the method of the first embodiment from the initial heating to obtaining the LaB6 cathode may be from 10 to 36 hours, preferably 10 to 24 hours and most preferably from 10 to 12 hours. One of ordinary skill recognizes that treatment times, treatment temperatures and humidity levels may be varied within the disclosure of the invention to obtain desired results.

The advantages of the present invention may be realized and obtained as particularly pointed out in the appended claims. As will be realized, the present invention is capable of other and different embodiments, and its several details are capable of modifications in various obvious respects, all without departing from the present invention. In this regard, the description herein is to be understood as illustrative in nature, and not as restrictive.

EXAMPLE

A freshly prepared carbon-coated LaB6 cathode designated as Cathode #4321 was determined to have a WF value of 2.701 eV at an operating temperature of 1780K. The cathode was allowed to cool to ambient temperature and then vacuum was released by opening the system to the atmosphere. The cathode was retained at ambient temperature and pressure for 30 minutes. Then the system was sealed, evacuated to pressure of 4×10$^{-8}$ Torr and heated to 1840K. The cathode was maintained at 1840K under the vacuum for 12 hours. After this treatment the cathode was tested as described above and the WF value at 1780K determined to be 2.668 eV. The WF$_1$-WF$_2$ value was thus 0.033 eV. FIG. 2 and FIG. 3 show the I-V curve for the WF determination. FIG. 2 shows the line approximations and FIG. 3 shows the actual data points obtained.

The invention claimed is:

1. A method to prepare a LaB6 cathode, comprising:
preparing an emitter structure of a LaB$_6$ single crystal, the emitter structure comprising:
   a lower cylindrical or rectangular portion,
   an upper tapered portion having a conical surface, and
   a flat surface truncated tip;
applying a carbon coating to at least the conical surface of the upper tapered portion while retaining the flat surface of the truncated tip free of carbon coating to obtain a precursor LaB6 cathode;
initially heating the precursor LaB6 cathode to a temperature of from 1700 K to 2000K under vacuum of 1×10$^{-7}$ to 1×10$^{-8}$ Torr;
cooling the first heat treated precursor LaB6 cathode to ambient temperature;
exposing the ambient temperature precursor LaB6 cathode to an atmosphere comprising water vapor; and
performing a second heating of the precursor LaB6 cathode at an emission temperature of from 1700 K to 2000K under vacuum of 1×10$^{-7}$ to 1×10$^{-8}$ Torr to obtain the LaB6 cathode wherein a difference between a Work Function value of the precursor LaB6 (WF1) and a Work Function value of the LaB6 cathode (WF2) satisfies the following relationship:

$$WF1 \backslash\backslash WF2 \geq 0.01 \text{ eV}.$$

2. The method of claim 1, wherein a relative humidity of the atmosphere comprising water vapor is from 70 to 95%.

3. The method of claim 1, wherein a time of exposure to the atmosphere comprising water vapor is from 30 minutes to 8 hours.

4. The method of claim 1, wherein a time of the initial heating is from 6 to 24 hours.

5. The method of claim 1 wherein a time of the second heating is from 3 to 6 hours.

6. The method of claim 1, wherein a total time of the method from the initial heating to obtaining the LaB6 cathode is from 10 to 36 hours.

7. The method of claim 1, wherein the atmosphere comprising water vapor is ambient air.

8. The method of claim 1, wherein the atmosphere comprising water vapor is a gas inert to reaction with $LaB_6$.

9. The method of claim 8 wherein the inert gas is at least one selected from the group consisting of argon and nitrogen.

\* \* \* \* \*